(12) United States Patent
Margulis

(10) Patent No.: US 11,226,230 B2
(45) Date of Patent: Jan. 18, 2022

(54) METHOD FOR NOISE REDUCTION AND A DETECTION CIRCUIT

(71) Applicant: Applied Materials Israel Ltd., Rehovot (IL)

(72) Inventor: Pavel Margulis, Ashdod (IL)

(73) Assignee: Applied Materials Israel Ltd., Rehovot (IL)

( * ) Notice: Subject to any disclaimer, the term of this patent is extended or adjusted under 35 U.S.C. 154(b) by 81 days.

(21) Appl. No.: 16/526,989

(22) Filed: Jul. 30, 2019

(65) Prior Publication Data
US 2021/0033456 A1    Feb. 4, 2021

(51) Int. Cl.
| | |
|---|---|
| *G01J 1/44* | (2006.01) |
| *H03F 3/08* | (2006.01) |
| *H03F 1/08* | (2006.01) |
| *H03F 1/26* | (2006.01) |
| *H03F 3/45* | (2006.01) |

(52) U.S. Cl.
CPC .............. *G01J 1/44* (2013.01); *H03F 1/083* (2013.01); *H03F 1/26* (2013.01); *H03F 3/08* (2013.01); *H03F 3/087* (2013.01); *H03F 3/45475* (2013.01); *G01J 2001/446* (2013.01); *G01J 2001/4413* (2013.01); *H03F 2200/129* (2013.01); *H03F 2203/45526* (2013.01)

(58) Field of Classification Search
CPC ............ G01J 1/44; G01J 2001/446; G01J 2001/4413; G01J 2001/444; H03F 3/08; H03F 2200/129; H03F 3/087; H03F 1/26; H03F 3/45475; H03F 1/083; H03F 2203/45526
See application file for complete search history.

(56) References Cited

U.S. PATENT DOCUMENTS

| | | | |
|---|---|---|---|
| 4,540,952 A * | 9/1985 | Williams | H03F 1/083 330/279 |
| 4,952,795 A * | 8/1990 | Gauthier | H03G 3/3084 250/214 A |
| 5,035,770 A | 7/1991 | Braun | |
| 6,359,254 B1 | 3/2002 | Brown | |

(Continued)

FOREIGN PATENT DOCUMENTS

KR    10-1999-0036438 A    5/1999

OTHER PUBLICATIONS

International Search Report and Written Opinion for Application No. PCT/US2020/041439, dated Oct. 23, 2020, 8 pages.

(Continued)

*Primary Examiner* — Jennifer D Bennett
(74) *Attorney, Agent, or Firm* — Kilpatrick Townsend & Stockton LLP

(57) ABSTRACT

A method and a detection circuit. The detection circuit may include (a) a photodiode that is configured to convert radiation to a photodiode current; (b) a photodiode bias circuit that is configured to bias the photodiode; (c) a dynamic resistance circuit that has a first terminal and a second terminal; (d) a transimpedance amplifier that is configured to amplify an output current of the dynamic resistance circuit to provide an output voltage, wherein the second terminal is coupled to a negative input port of the amplification circuit; and (e) a conductor that is coupled between the first terminal and an anode of the photodiode.

13 Claims, 3 Drawing Sheets

(56) References Cited

U.S. PATENT DOCUMENTS

| | | | | |
|---|---|---|---|---|
| 6,392,219 B1* | 5/2002 | McCormick | ....... | H04B 10/6931 |
| | | | | 250/214 R |
| 7,825,735 B1* | 11/2010 | Wessendorf | .............. | H03F 3/08 |
| | | | | 330/308 |
| 2002/0003649 A1* | 1/2002 | Feng | ...................... | H04B 10/69 |
| | | | | 398/202 |
| 2004/0140438 A1 | 7/2004 | Gerlach et al. | | |
| 2005/0073775 A1 | 4/2005 | Chang et al. | | |
| 2005/0218994 A1* | 10/2005 | Guckenberger | ........ | H03F 3/343 |
| | | | | 330/308 |
| 2009/0079958 A1* | 3/2009 | Gunther | .................. | G01S 17/08 |
| | | | | 356/5.01 |

OTHER PUBLICATIONS

U.S. Appl. No. 16/530,331 Notice of Allowance dated Jan. 14, 2021, 8 pages.
U.S. Appl. No. 16/530,331 Corrected Notice of Allowability dated Mar. 11, 2021, 5 pages.

* cited by examiner

METHOD FOR NOISE REDUCTION AND A DETECTION CIRCUIT

BACKGROUND

A detection circuit may include a photodiode bias circuit, a photodiode, and a transimpedance amplifier.

The photodiode converts radiation signals to a photodiode current. The photodiode is biased by the photodiode bias circuit.

The photodiode current is relatively weak and has to be amplified.

A trans-impedance amplifier is used to amplify the photodiode current. The trans-impedance amplifier has an amplification circuit that is fed by one or more voltage supplies.

The photodiode has a photodiode capacitance (C).

The photodiode current flows over a loop that may include the trans-impedance amplifier and a conductor coupled between the photocathode and the trans-impedance amplifier.

The loop has an inductance (L). The loop and the photodiode may form a resonant circuit. The resonant circuit may introduce peaks in frequency response of the detection circuit and introduce distortions in a transient response of the detection circuit.

In order to prevent the resonant circuit from introducing peaks and distortions, a damping resistor may be provided between the transimpedance amplifier and the conductor.

The damping resistor introduces a thermal noise current that equals a square root of (4*K*T/R), wherein K is the Boltzmann constant, T is the absolute temperature and R is the resistance of the damping resistor.

The value of R may be determined to achieve a desired quality factor (Q) of a part of the detection circuit that includes the damping resistor, the loop and the photodiode. Q may equal (1/R) multiplied by a square root of (L/C).

There is a growing need to provide a detection circuit with a lower noise while maintaining a desired value of quality factor.

SUMMARY

There may be provided a detection circuit that may include (a) a photodiode that is configured to convert radiation to a photodiode current; (b) a photodiode bias circuit that is configured to bias the photodiode; (c) a dynamic resistance circuit that has a first terminal and a second terminal; (d) a transimpedance amplifier that is configured to amplify an output current of the dynamic resistance circuit to provide an output voltage; wherein the second terminal is coupled to a negative input port of the amplification circuit; and (e) a conductor that is coupled between the first terminal and an anode of the photodiode.

There may be provided a method that may include biasing a photodiode by a photodiode bias circuit; converting, by the photodiode, radiation that impinges on the photodiode to a photodiode current; receiving by a dynamic resistance circuit the photodiode current and outputting by the dynamic resistance circuit an output current of the dynamic resistance circuit; and amplifying, by a transimpedance amplifier, the output current of the dynamic resistance circuit to provide an output voltage; wherein the dynamic resistance circuit comprises a first terminal and a second terminal; wherein the second terminal is coupled to a negative input port of the amplification circuit; and wherein an anode of the photodiode is coupled via a conductor to the first terminal.

BRIEF DESCRIPTION OF THE DRAWINGS

One or more examples of a subject matter may be particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

Figure 1:
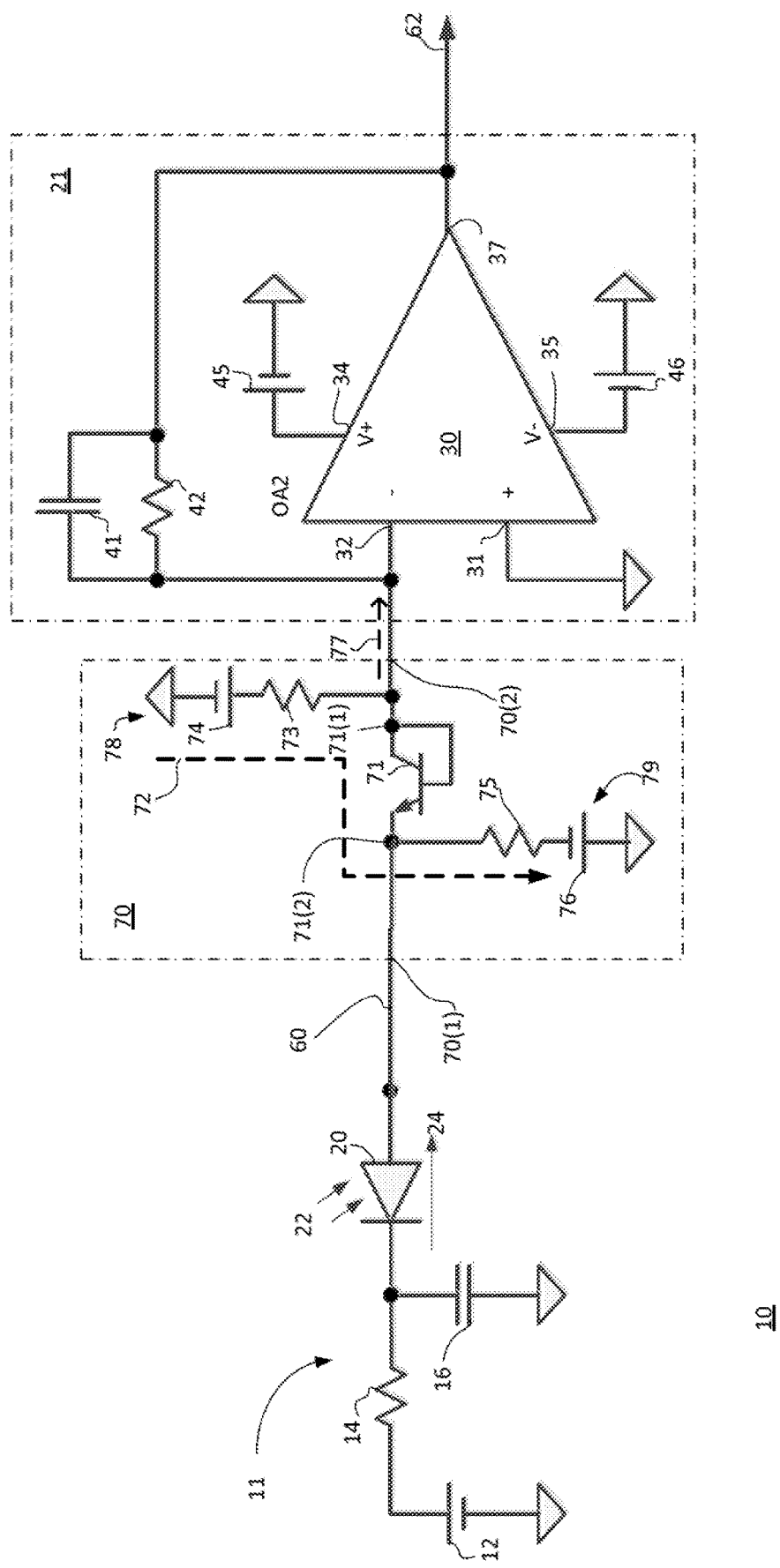
FIG. 1 illustrates an example of a detection circuit.

In the following detailed description, numerous specific details are set forth in order to provide a thorough understanding of the detection circuit and method. However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a detection circuit capable of executing the method.

Any reference in the specification to a detection circuit should be applied mutatis mutandis to a method that may be executed by the detection circuit.

There may be provided a detection circuit with a low noise.

The term "and/or" means additionally or alternatively.

There may be provided a detection circuit that may include a photodiode, a photodiode bias circuit, a conductor, a dynamic resistance circuit, and a transimpedance amplifier.

Assuming that the detection circuit should maintain a certain quality factor (Q) then the resistance of the dynamic resistance circuit should be set to a certain value.

The resistance (Rdyn) of the dynamic resistance circuit may be set to have the certain value by biasing an active element of the dynamic resistance circuit by a direct (DC) bias current Ibias. Supplying Ibias of a certain value will achieve a dynamic resistance circuit resistance Rdyn according to the following equation: $Rdyn=K*T/(q*Ibias)$, wherein K is the Boltzmann constant, T is the absolute temperature, and q is a charge of an electron.

Ibias may be supplied by a direct current (DC) bias circuit of the dynamic resistance circuit.

The dynamic resistance circuit introduces a thermal noise current that equals a square root of $2*q*Ibias$ which equals a square root of $4*K*T/(2*Rdyn)$.

Assuming that Rdyn equals R (the resistance of the prior art resistor)—then the dynamic resistance circuit introduces a thermal noise current that equals $4*K*T/(2*R)$—which is smaller (by a factor of $1/\sqrt{2}$) than the thermal noise current introduced by a resistor having a same resistance R.

FIG. 1 illustrates an example of detection circuit 10.

Detection circuit 10 includes a photodiode 20, photodiode bias circuit 11, conductor 60, dynamic resistance circuit 70, and transimpedance amplifier 21.

Photodiode 20 is configured to convert radiation 22 to a photodiode current 24.

Photodiode bias circuit 11 is configured to bias the photodiode 20.

The photodiode bias circuit 11 includes a photodiode bias voltage supply 12, a photodiode bias resistor 14, and a photodiode bias capacitor 16.

A cathode of the photodiode 20 is connected to a second end of the photodiode bias capacitor 16 and to a first end of the photodiode bias resistor 14.

A positive terminal of the photodiode bias voltage supply 12 is connected to a second end of the photodiode bias resistor 14.

Dynamic resistance circuit 70 includes a first terminal 70(1) and a second terminal 70(2), active element 71, and a direct current (DC) bias circuit that is configured to set a value of a resistance of the dynamic resistance circuit 70 by flowing a bias DC current (denoted Ibias 72) through the active element 71.

FIG. 1 illustrates an active element that is a bipolar transistor having an emitter, a base and a collector wherein the base is coupled to the collector.

The active element may be a diode or another transistor.

First terminal 70(1) is coupled to the conductor 60. Second terminal 70(2) is coupled to a negative input port of an amplification circuit 30 of the transimpedance amplifier 21.

Dynamic resistance circuit 70 outputs an output current through second terminal 70(2). The output current of the dynamic resistance circuit substantially equals the photodiode current 24. Substantially equals may include slight deviations (for example up to 10 percent) from the photodiode current.

The DC bias circuit of the dynamic resistance circuit 70 may include (i) a positive DC bias branch 78 that is coupled to a first port of the active element (for example to the collector), and (ii) a negative DC bias branch 79 that is coupled to a second port (for example the emitter) of the active element. The DC bias current 72 flows from the positive DC bias branch 78 through the active element and to the negative DC bias branch 79. The flow of the DC bias current is substantially indifferent to the photodiode current.

The positive DC bias branch 78 may include first resistor 73 and a first voltage supply 74. The first resistor 73 is coupled between the first port 71(1) of the active element 71 and a positive port of the first voltage supply 74.

The negative DC bias branch 79 may include a second resistor 75 and a second voltage supply 76. The second resistor 75 is coupled between the second port 71(2) of the active element and a negative port of the second voltage supply 76.

The bias DC current 72 is stronger (and usually much stronger) than the photodiode current.

The quality factor of a certain circuit may be 0.577 or may have other values. The certain circuit includes dynamic resistance circuit 70, photodiode 20, and a loop through which the photodiode current and the output current 77 of the dynamic resistance circuit 70 flow.

Figure 2:
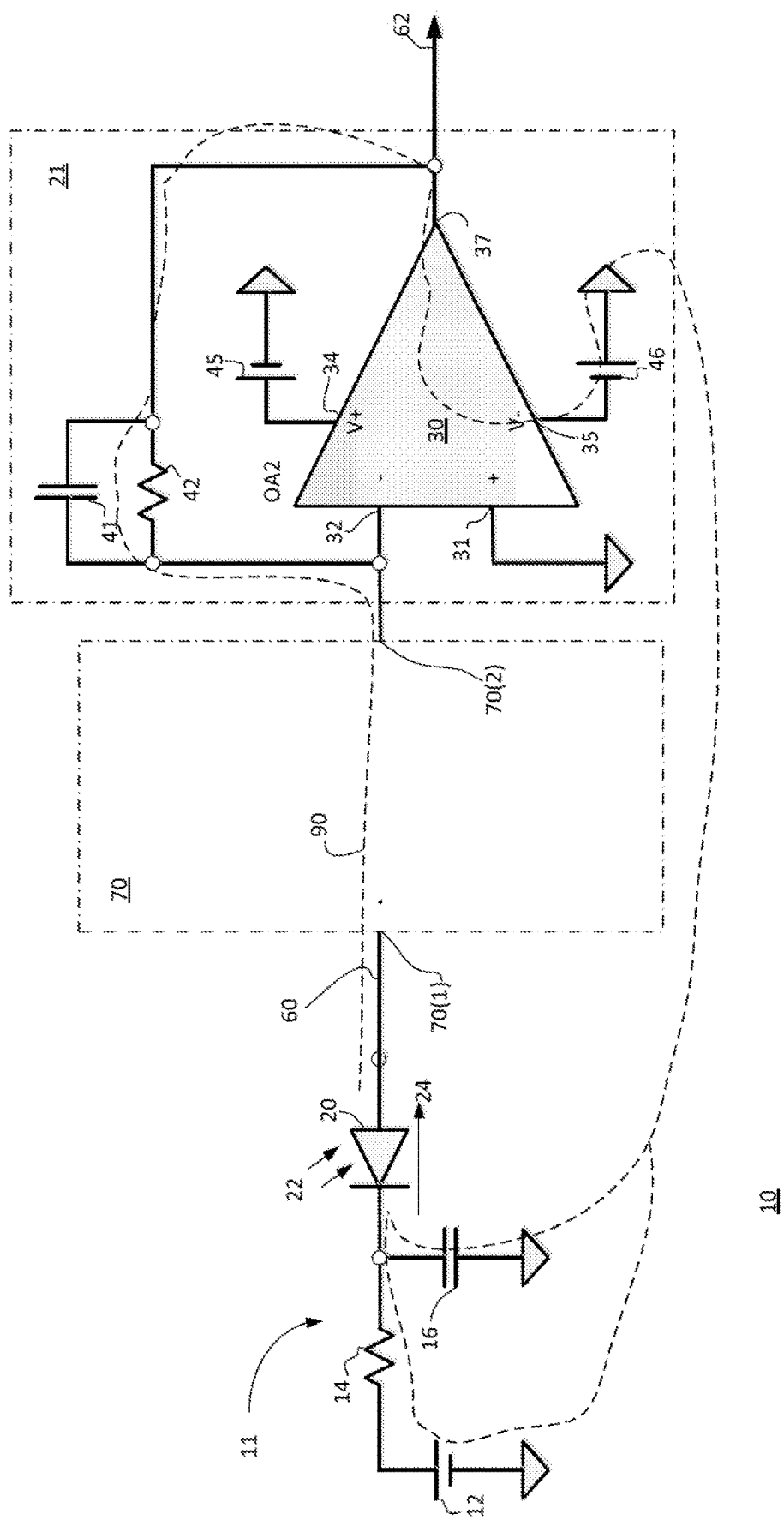
FIG. 2 illustrates an example of a loop formed in the detection circuit of FIG. 1.

The loop may include photodiode bias circuit 11, photodiode 20, conductor 60, dynamic resistance circuit 70 and a part of the transimpedance amplifier 21. FIG. 2 illustrates an example of the loop 90.

Referring back to FIG. 1, the transimpedance amplifier 21 may be configured to amplify an output current of the dynamic resistance circuit to provide an output voltage. The transimpedance amplifier 21 includes an amplification circuit 30 and an additional circuit.

The amplification circuit 30 includes a negative input port 32, a positive input port 31 (which is grounded), a positive supply port 34, a negative supply port 35 and an output port 37.

The positive supply port 34 is connected to a positive terminal of the positive voltage supply 45. A negative terminal of the positive voltage supply 45 is grounded.

The negative supply port 35 is connected to a negative terminal of the negative voltage supply 46. A positive terminal of the negative voltage supply 46 is grounded.

Figure 3:
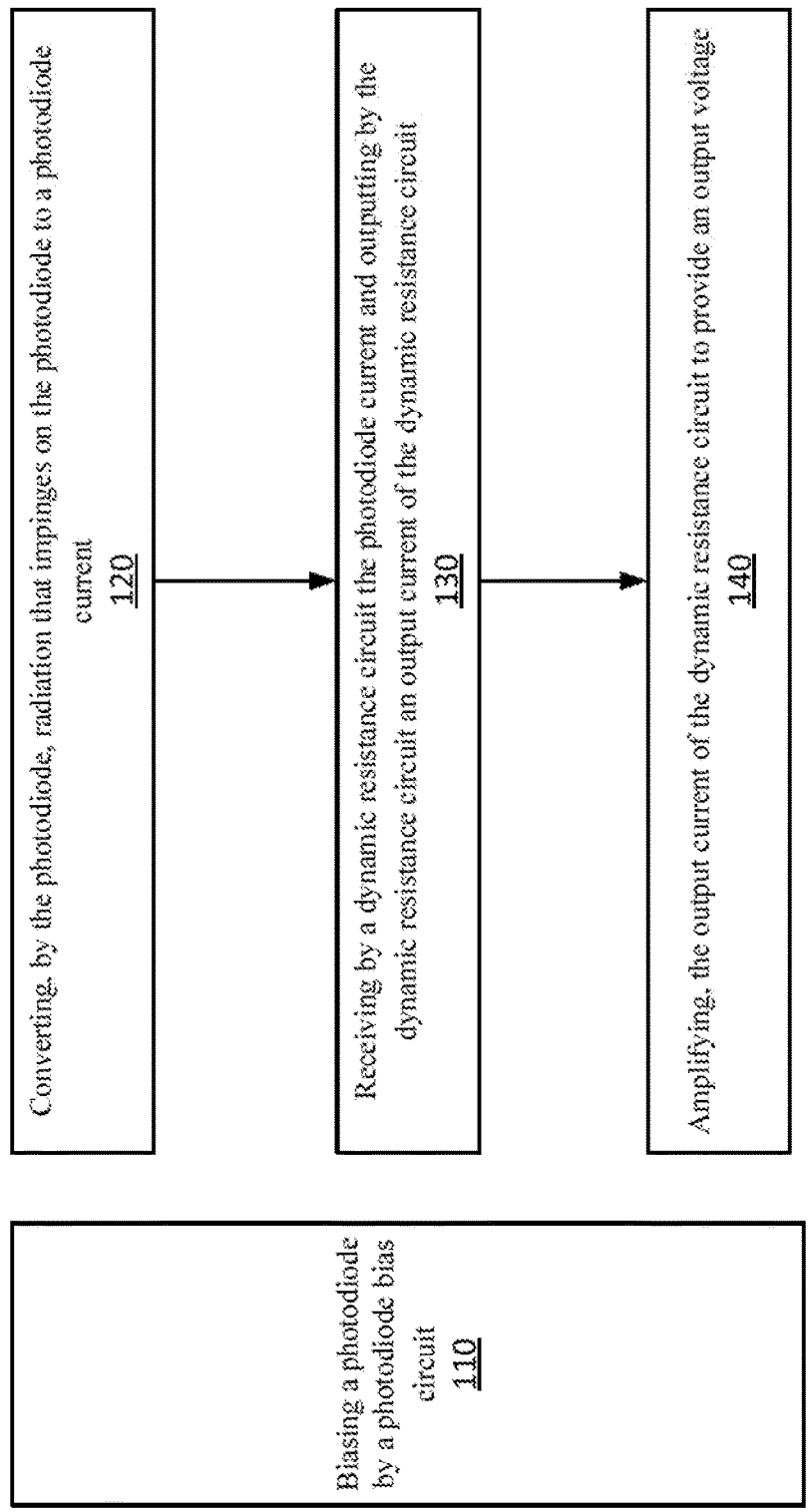
FIG. 3 illustrates an example of a method.

FIG. 3 is an example of a method 100.

Method 100 may be for detecting radiation.

Method 100 may start by steps 110 and 120.

Step 110 may include biasing a photodiode by a photodiode bias circuit.

Method 100 may also include step 120 of converting, by the photodiode, radiation that impinges on the photodiode to a photodiode current.

Step 120 may be followed by step 130 of receiving by a dynamic resistance circuit the photodiode current and outputting by the dynamic resistance circuit an output current of the dynamic resistance circuit.

Step 130 may be followed by step 140 of amplifying, the output current of the dynamic resistance circuit to provide an output voltage. The dynamic resistance circuit may include a first terminal and a second terminal. The second terminal is coupled to a negative input port of the amplification circuit. An anode of the photodiode is coupled via a conductor to the first terminal.

Steps 120, 130 and 140 may be executed while step 110 is executed.

Step 110 may be executed in a continuous or non-continuous manner. For example—step 110 may be executed when the detection circuit is active and may be terminated when the detection circuit is idle or shut down.

Step 110 may also include biasing an active element of the dynamic resistance circuit by a direct current (DC) bias current to set the resistance of the dynamic resistance circuit to a desired value.

In the foregoing specification, the embodiments of the disclosure has been described with reference to specific examples of embodiments of the embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

I claim:

1. A detection circuit, comprising:
   a photodiode that is configured to convert radiation to a photodiode current;
   a photodiode bias circuit that is configured to bias the photodiode;
   a dynamic resistance circuit that comprises a first terminal and a second terminal;
   a transimpedance amplifier that is configured to amplify an output current of the dynamic resistance circuit to provide an output voltage; wherein the second terminal is coupled to a negative input port of the amplification circuit, and the output current of the dynamic resistance circuit substantially equals the photodiode current; and
   a conductor that is coupled between the first terminal and an anode of the photodiode.

2. The detection circuit according to claim 1 wherein the dynamic resistance circuit comprises an active element that is a diode.

3. The detection circuit according to claim 1 wherein the dynamic resistance circuit comprises an active element that is a bipolar transistor that comprises a base, an emitter and a collector, wherein the base is coupled to the collector.

4. The detection circuit according to claim 1 wherein the dynamic resistance circuit comprises an active element, and a direct current (DC) bias circuit that is configured to set a value of a resistance of the dynamic resistance circuit by flowing a bias DC current through the active element.

5. The detection circuit according to claim 4 wherein the DC bias circuit comprises (a) a positive DC bias branch coupled to a first port of the active element; and (b) a negative DC bias branch that is coupled to a second port of the active element.

6. The detection circuit according to claim 5 wherein the positive DC bias branch comprises a first resistor and a first voltage supply, wherein the first resistor is coupled between the first port of the active element and a positive port of the first voltage supply.

7. The detection circuit according to claim 5 wherein the negative DC bias branch comprises a second resistor and a second voltage supply, wherein the second resistor is coupled between the second port of the active element and a negative port of the second voltage supply.

8. The detection circuit according to claim 4 wherein, wherein the bias DC current is stronger than the photodiode current.

9. The detection circuit according to claim 1 wherein a quality factor of a circuit that comprises (i) the dynamic resistance circuit, (ii) the photodiode, and (iii) a loop through which the photodiode current flows, is 0.577.

10. A method for detecting radiation that impinges on a photodiode, the method comprises:
  biasing the photodiode by a photodiode bias circuit;
  converting, by the photodiode, the radiation that impinges on the photodiode to a photodiode current;
  receiving, by a dynamic resistance circuit, the photodiode current;
  outputting, by the dynamic resistance circuit, an output current of the dynamic resistance circuit; and
  amplifying, by a transimpedance amplifier, the output current of the dynamic resistance circuit to provide an output voltage; wherein the dynamic resistance circuit comprises a first terminal and a second terminal; wherein the second terminal is coupled to a negative input port of the amplification circuit; wherein the output current of the dynamic resistance circuit substantially equals the photodiode current; and wherein an anode of the photodiode is coupled via a conductor to the first terminal.

11. The method according to claim 10 comprising biasing an active element of the dynamic resistance circuit by direct current (DC) bias circuit, wherein the biasing sets a value of a resistance of the dynamic resistance circuit.

12. The method according to claim 10 wherein the dynamic resistance circuit comprises a diode.

13. The method according to claim 10 wherein the dynamic resistance circuit comprises a bipolar transistor that comprises a base, an emitter and a collector, wherein the base is coupled to the collector.

* * * * *